(12) United States Patent
Kamiyama

(10) Patent No.: US 11,688,714 B2
(45) Date of Patent: *Jun. 27, 2023

(54) SEMICONDUCTOR PACKAGE WITH THREE LEADS

(71) Applicant: SHINDENGEN ELECTRIC MANUFACTURING CO., LTD., Chiyoda-ku (JP)

(72) Inventor: Yoshihiro Kamiyama, Hanno (JP)

(73) Assignee: SHINDENGEN ELECTRIC MANUFACTURING CO., LTD., Chiyoda-ku (JP)

( * ) Notice: Subject to any disclaimer, the term of this patent is extended or adjusted under 35 U.S.C. 154(b) by 600 days.

This patent is subject to a terminal disclaimer.

(21) Appl. No.: 16/061,003

(22) PCT Filed: Sep. 5, 2017

(86) PCT No.: PCT/JP2017/031997
§ 371 (c)(1),
(2) Date: Jun. 11, 2018

(87) PCT Pub. No.: WO2019/049214
PCT Pub. Date: Mar. 14, 2019

(65) Prior Publication Data
US 2021/0013170 A1 Jan. 14, 2021

(51) Int. Cl.
*H01L 21/768* (2006.01)
*H01L 23/522* (2006.01)
(Continued)

(52) U.S. Cl.
CPC .......... *H01L 24/37* (2013.01); *H01L 23/3107* (2013.01); *H01L 23/49575* (2013.01); *H01L 24/29* (2013.01); *H01L 2224/37012* (2013.01)

(58) Field of Classification Search
CPC ... H01L 24/37; H01L 24/40; H01L 23/49524; H01L 23/49562; H01L 24/41;
(Continued)

(56) References Cited

U.S. PATENT DOCUMENTS 4,722,470 A * 2/1988 Johary ............... H01R 43/0235
228/259
4,935,803 A * 6/1990 Kalfus ............... H01L 23/49562
257/E23.044
(Continued)

FOREIGN PATENT DOCUMENTS

JP 63-170961 U 11/1988
JP 2002-100716 A 4/2002
(Continued)

OTHER PUBLICATIONS

Netherlands Search Report dated Jan. 10, 2019 in Patent Application No. 2021120, 15 pages (with English translation and English translation of categories of cited documents).
(Continued)

*Primary Examiner* — Eva Y Montalvo
*Assistant Examiner* — Tenley H Schofield
(74) *Attorney, Agent, or Firm* — Oblon, McClelland, Maier & Neustadt, L.L.P.

(57) ABSTRACT

A semiconductor device is provided, including a seal portion; an electronic element within the seal portion; first, second, and third lead terminals; first and second connecting elements; and first and second conductive bonding agents, one end of the first connecting element having a protrusion downward and electrically connected to a control electrode of the electronic element with the first conductive bonding agent, a first side surface extending from the one end to the other end of the first connecting element is parallel to an extending direction along which the one end of the second
(Continued)

connecting element extends, a wall portion being disposed on a top surface of the one end of the second lead terminal, and the wall portion being in contact with the other end of the first connecting element.

9 Claims, 5 Drawing Sheets

(51) Int. Cl.
*H01L 23/00* (2006.01)
*H01L 23/31* (2006.01)
*H01L 23/495* (2006.01)

(58) Field of Classification Search
CPC . H01L 2924/13091; H01L 2224/73265; H01L 2224/37011
See application file for complete search history.

(56) References Cited

U.S. PATENT DOCUMENTS

| | | | | |
|---|---|---|---|---|
| 6,521,982 | B1* | 2/2003 | Crowley | H01L 23/49513 257/676 |
| 9,685,397 | B2* | 6/2017 | Choi | H01L 23/4093 |
| 2006/0108671 | A1* | 5/2006 | Kasem | H01L 23/3107 257/676 |
| 2007/0057368 | A1 | 3/2007 | Ho et al. | |
| 2007/0290336 | A1* | 12/2007 | Sun | H01L 24/41 257/735 |
| 2009/0121331 | A1* | 5/2009 | Cruz | H01L 24/95 257/676 |
| 2009/0218673 | A1 | 9/2009 | Sun et al. | |
| 2012/0068357 | A1* | 3/2012 | Saito | H01L 23/49524 257/774 |
| 2014/0061821 | A1* | 3/2014 | Kawano | H01L 23/49568 257/401 |
| 2014/0103510 | A1* | 4/2014 | Andou | H01L 23/49562 257/676 |
| 2014/0347838 | A1* | 11/2014 | Nagaya | H01L 23/49548 361/783 |
| 2015/0069592 | A1 | 3/2015 | Tamura et al. | |
| 2015/0214138 | A1 | 7/2015 | Takagi et al. | |
| 2017/0178928 | A1* | 6/2017 | Williams | H01L 24/40 |

FOREIGN PATENT DOCUMENTS

| | | | | |
|---|---|---|---|---|
| JP | 2004-31516 | A | | 1/2004 |
| JP | 2009-238859 | A | | 10/2009 |
| JP | 2011-49244 | A | | 3/2011 |
| JP | 2012-69640 | A | | 4/2012 |
| JP | 2013016623 | A | * | 1/2013 ............ H01L 24/33 |
| JP | 2015-142077 | A | | 8/2015 |

OTHER PUBLICATIONS

International Search Report dated Nov. 28, 2017 in PCT/JP2017/031997 filed Sep. 5, 2017 (with Translation of Category of Cited Documents in attached foreign language Search Report).
English translation of the International Preliminary Report on Patentability dated Mar. 5, 2020 in PCT/JP2017/031997, 8 pages.
Chinese Office Action dated Mar. 13, 2023 in Chinese Patent Application No. 201780004177.0 filed on Sep. 5, 2017, with machine translation, total 10 pages.

* cited by examiner

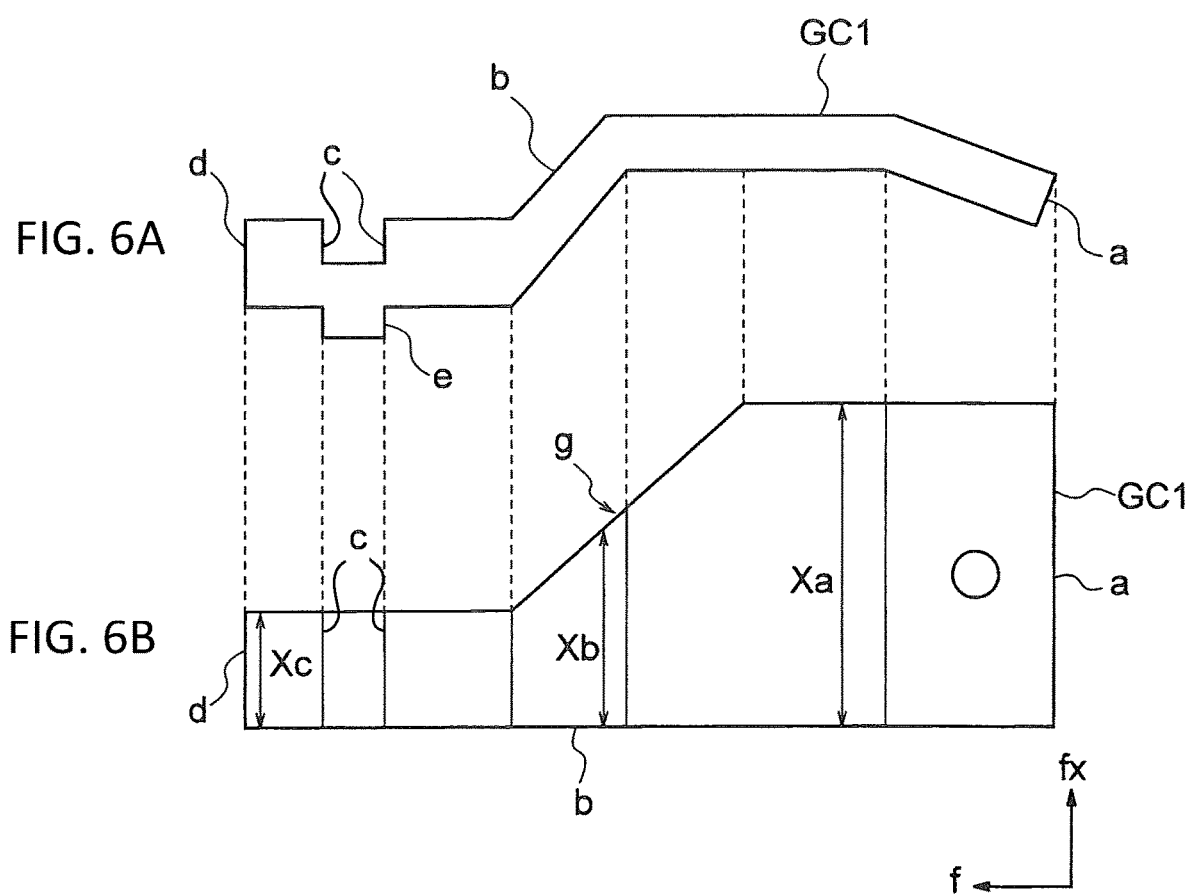

SEMICONDUCTOR PACKAGE WITH THREE LEADS

TECHNICAL FIELD

The present invention relates to a semiconductor device.

BACKGROUND ART

Inverter devices configured to convert DC power that is inputted from a DC power supply to AC power have conventionally been known as an example of semiconductor devices such as electronic modules.

Such an inverter device is used, for example, to convert a DC voltage to a three-phase AC voltage to drive a three-phase motor.

In a conventional semiconductor device, for example, control electrodes (gate electrodes) of high-side and low-side electronic elements (MOSFETs) and lead terminals (lead frames) are connected by soldering, with connecting elements (gate clips) (for example, see Patent Document 1 and Patent Document 2).

In such a semiconductor device, it is difficult to connect the control electrode (gate electrode) of an electronic element with one of the connecting elements since the control electrode is smaller than other input/output electrodes (source electrode and drain electrode). The control electrode needs to be stably connected to one end of the lead terminal without pushing down the connecting element.

If a failure is caused in the connection of the connecting element, the controllability of the electronic element may be degraded, which may lead to a degradation of reliability of the semiconductor device (inverter device).

PRIOR ART DOCUMENT

Patent Document

[Patent Document 1] JP 2002-100716 A
[Patent Document 2] JP 2009-238859 A

SUMMARY OF THE INVENTION

Problem to be Solved by the Invention

Under the circumstance, it is an object of the present invention to provide a semiconductor device, in which connection failures of connecting elements are prevented to improve reliability.

Solution to Problem

A semiconductor device according to an embodiment in an aspect of the present invention includes:
 a seal portion;
 an electronic element disposed within the seal portion;
 a first lead terminal having one end, on a top surface of which the electronic element is disposed within the seal portion, and another end that is exposed from the seal portion;
 a second lead terminal having one end that is disposed to be close to the one end of the first lead terminal within the seal portion, and another end that is exposed from the seal portion;
 a first connecting element disposed within the seal portion, and having one end that is electrically connected to a control electrode of the electronic element, and another end that is electrically connected to the one end of the second lead terminal;
 a first conductive bonding agent for joining together the control electrode of the electronic element and the one end of the first connecting element in a conductive manner; and
 a second conductive bonding agent for joining together the other end of the first connecting element and the one end of the second lead terminal,
 wherein the one end of the first connecting element has a protrusion that protrudes downward and is electrically connected to the control electrode of the electronic element with the first conductive bonding agent,
 wherein a width of the one end of the first connecting element is narrower than a width of the other end of the first connecting element, and the width of the other end of the first connecting element is narrower than a width of the one end of the second lead terminal, and
 wherein a first side surface extending from the one end to the other end of the first connecting element is parallel to a straight line extending in a horizontal direction.

In the semiconductor device,
 a second side surface extending from the one end to the other end of the first connecting element on a side opposite to the first side surface is angled in an area between the one end and the other end of the first connecting element so that the width of the one end of the first connecting element is narrower than the width of the other end of the first connecting element.

In the semiconductor device, which further includes:
 a third lead terminal having one end disposed to be close to the one end of the first lead terminal within the seal portion, and another end that is exposed from the seal portion; and
 a second connecting element having one end that is electrically connected to an input/output electrode of the electronic element, and another end that is electrically connected to the one end of the third lead terminal,
 wherein the first side surface of the first connecting element is adjacent to the second connecting element.

In the semiconductor device,
 a height of a top surface of the one end of the second lead terminal is higher than a height of a top surface of the control electrode of the electronic element.

In the semiconductor device,
 the other end of the first connecting element is bent downward.

In the semiconductor device,
 the first conductive bonding agent and the second conductive bonding agent are soldering materials.

In the semiconductor device,
 the protrusion at the one end of the first connecting element is formed by pressing the one end from above to protrude downward.

In the semiconductor device,
 a side opposite to the protrusion of the one end of the first connecting element is recessed.

In the semiconductor device,
 a width of the second connecting element is broader than a width of the first connecting element.

In the semiconductor device,
 a tip of the one end of the first connecting element is spaced apart from the top surface of the one end of the first lead terminal.

In the semiconductor device, a wall portion is disposed on a top surface of the one end of the second lead terminal for blocking the second conductive bonding agent.

In the semiconductor device, the wall portion is in contact with the other end of the first connecting element.

In the semiconductor device, the second conductive bonding agent is in contact with the wall portion due to a surface tension force when the other end of the first connecting element and the one end of the second lead terminal are joined together.

In the semiconductor device, a height of the wall portion on the top surface of the one end of the second lead terminal is higher that a height of the second conductive bonding agent on the top surface of the one end of the second lead terminal.

In the semiconductor device, the wall portion is disposed on the top surface of the one end of the second lead terminal so as to be perpendicular to a direction in which the one end of the second lead terminal extends.

Effects of the Invention

A semiconductor device according to an aspect of the present invention includes a seal portion, an electronic element disposed within the seal portion, a first lead terminal having one end, on a top surface of which the electronic element is disposed within the seal portion, and another end that is exposed from the seal portion, a second lead terminal having one end that is close to the one end of the first lead terminal within the seal portion, and another end that is exposed from the seal portion, a first connecting element (gate clip) disposed within the seal portion, and having one end that is electrically connected to a control electrode (gate electrode) of the electronic element, and another end that is electrically connected to the one end of the second lead terminal, a first conductive bonding agent for joining together the control electrode of the electronic element and the one end of the first connecting element in a conductive manner, and a second conductive bonding agent for joining together the other end of the first connecting element and the one end of the second lead terminal in a conductive manner.

The one end of the first connecting element has a protrusion that protrudes downward and is electrically connected to the control electrode of the electronic element with the first conductive bonding agent.

The width of the one end of the first connecting element is narrower than the width of the other end of the first connecting element, which is narrower than the width of the one end of the second lead terminal.

A first side surface extending from the one end to the other end of the first connecting element is parallel to a straight line extending in a horizontal direction.

Thus, the one end of the first connecting element is connected to the control electrode, which is small, of the electronic element by the protrusion, and the other end, which is broader than the one end, of the first connecting element is stably connected to the one end of the second lead terminal, which is broad (so that the first connecting element does not fall over).

Thus, in the semiconductor device according to the present invention, connection failures of connecting elements may be prevented to improve reliability.

BRIEF DESCRIPTION OF THE DRAWINGS

FIG. 6A is a cross-sectional view illustrating the example of the structure of the gate clip (connecting element) shown in FIG. 5.

FIG. 6B is a top view illustrating the example of the structure of the gate clip (connecting element) shown in FIG. 5.

EMBODIMENTS FOR CARRYING OUT THE INVENTION

Embodiments of the present invention will now be described with reference to the accompanying drawings.

First Embodiment

Figure 1:
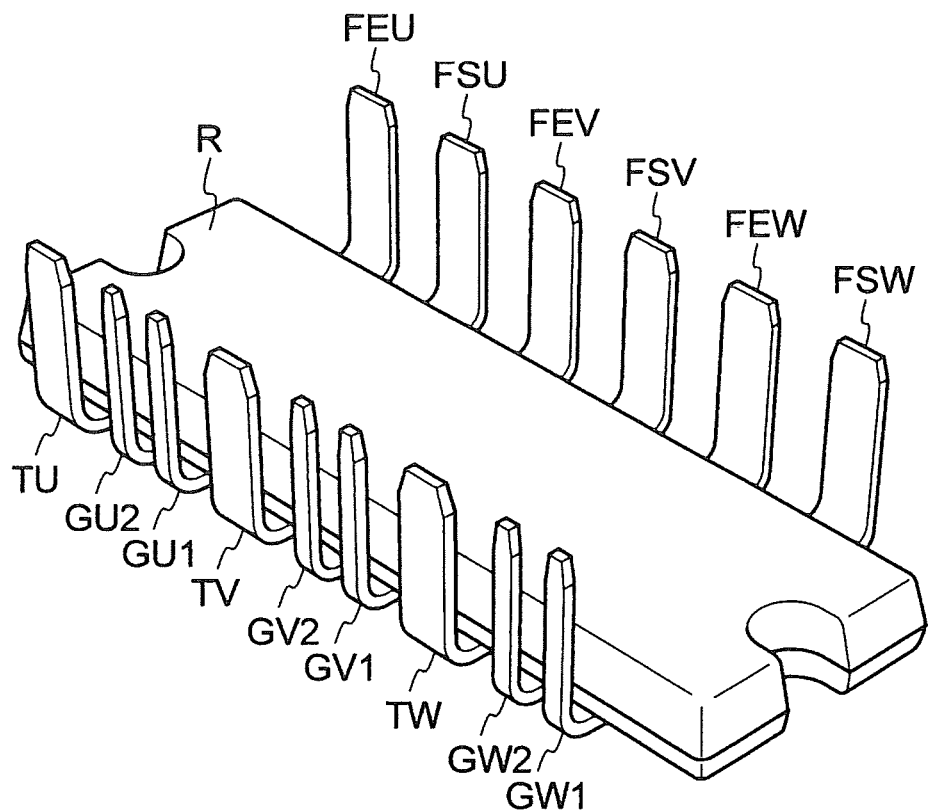
FIG. 1 is a perspective view illustrating an example of an outer appearance of a semiconductor device 100 according to a first embodiment.
Figure 2:
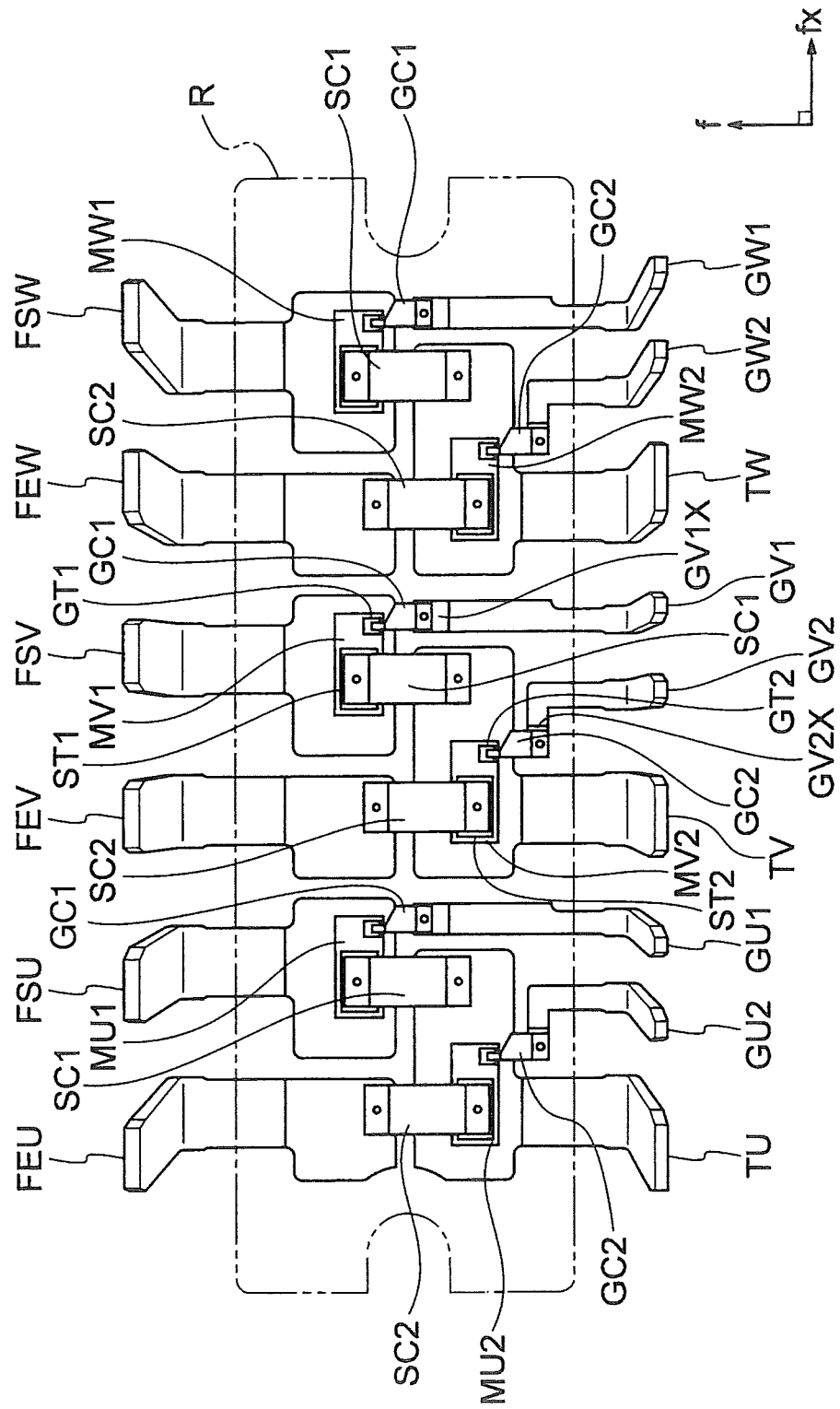
FIG. 2 is a top view illustrating an example of a configuration of the semiconductor device 100 shown in FIG. 1.
Figure 3:
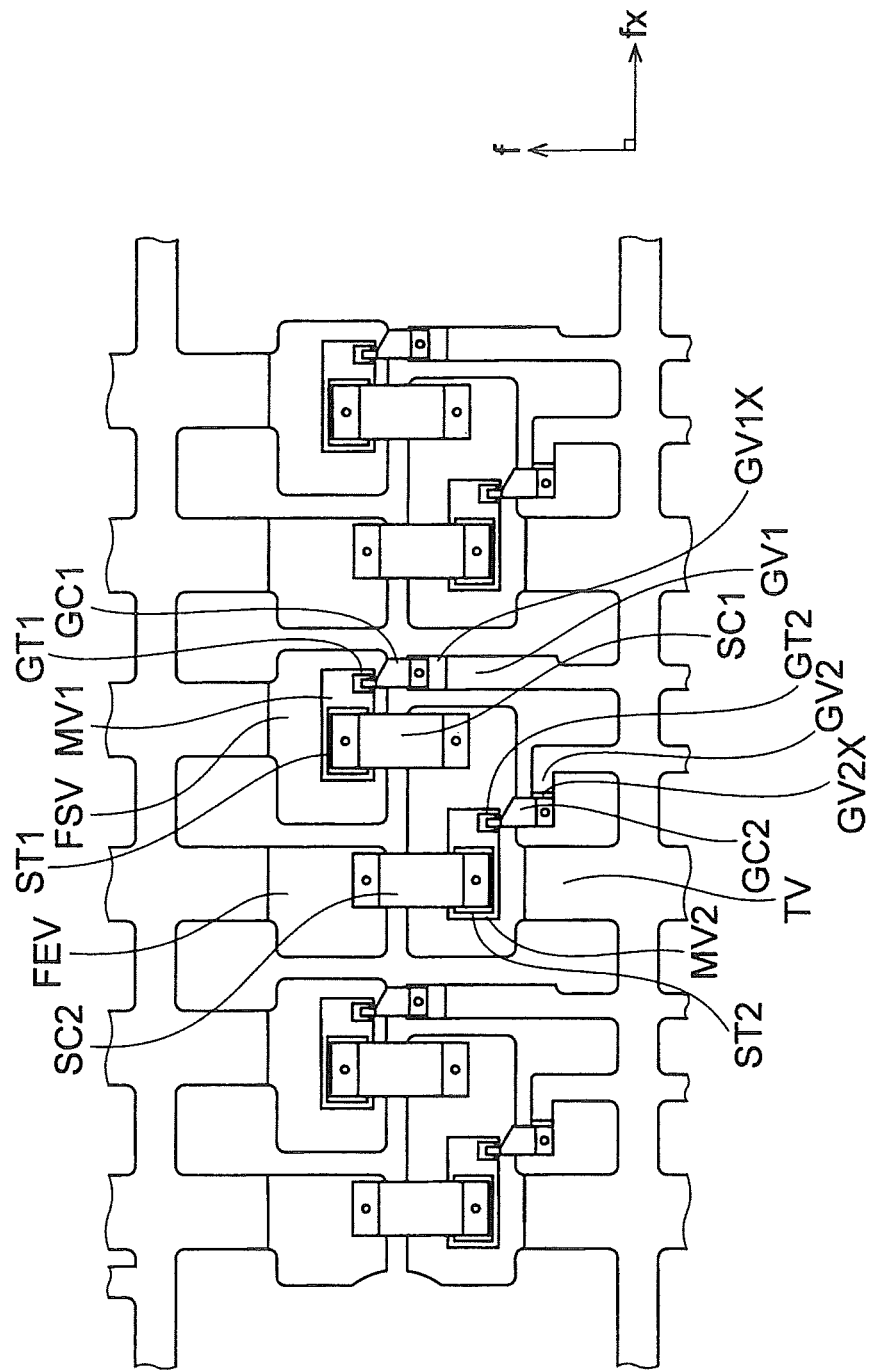
FIG. 3 is a top view illustrating an example of a configuration of electronic elements attached to the lead frame before being sealed.
Figure 4:
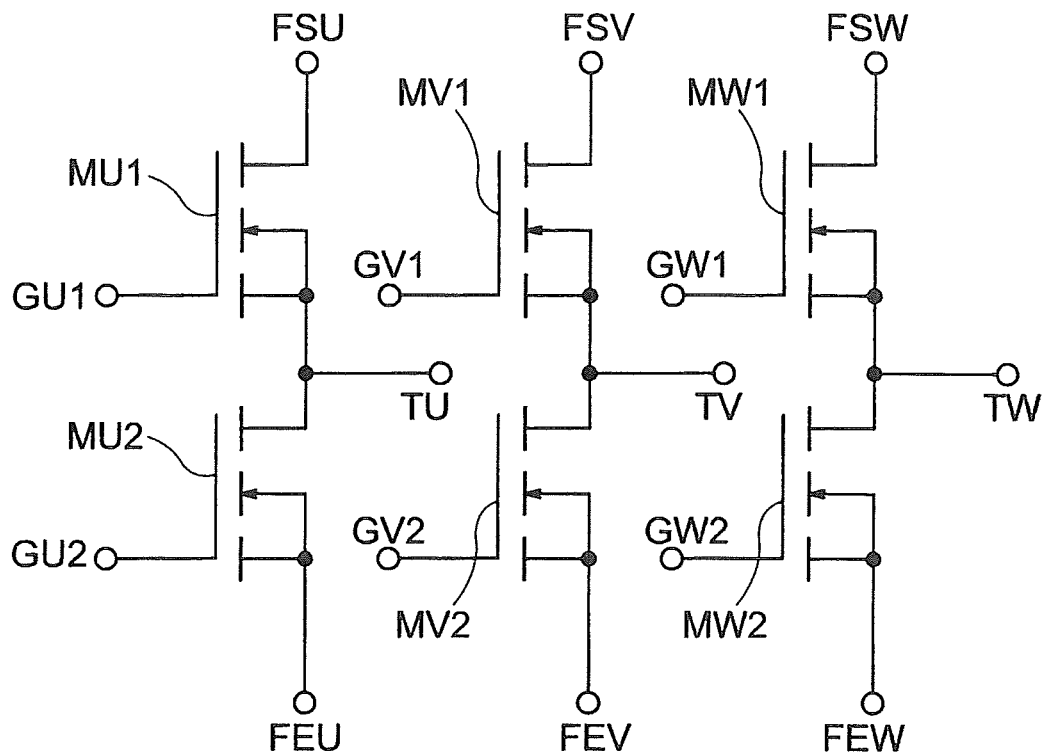
FIG. 4 is a circuit diagram illustrating an example of a circuit configuration of the semiconductor device 100 shown in FIG. 1.

FIG. 1 is a perspective view illustrating an example of an outer appearance of a semiconductor device 100 according to a first embodiment. FIG. 2 is a top view illustrating an example of a configuration of the semiconductor device 100 shown in FIG. 1. FIG. 3 is a top view illustrating an example of a configuration of electronic elements attached to the lead frame before being sealed. FIG. 4 is a circuit diagram illustrating an example of a circuit configuration of the semiconductor device 100 shown in FIG. 1. In FIG. 2, a seal portion R is illustrated to be transparent.

The semiconductor device 100 according to the first embodiment is an inverter device that converts DC power inputted from a DC power supply to AC power, which is outputted.

As shown in FIGS. 1 to 4, the semiconductor device 100 includes a seal portion R, high-side first electronic elements MU1, MV1, and MW1, low-side second electronic elements MU2, MV2, and MW2, power-supply lead terminals (first lead terminals) FSU, FSV, and FSW, ground lead terminals (fifth lead terminals) FEU, FEV, and FEW, input/output lead terminals (third lead terminals) TU, TV, and TW, high-side-gate lead terminals (second lead terminals) GU1, GV1, and GW1, low-side-gate lead terminals (fourth lead terminals) GU2, GV2, and GW2, a high-side first connecting element (gate clip) GC1, a low-side third connecting element (gate clip) GC2, a high-side second connecting element (source clip) SC1, and a low-side fourth connecting element (source clip) SC2.

In the example shown in FIGS. 1 and 2, the power-supply lead terminals FSU, FSV, and FSW, and the ground lead terminals FEU, FEV, and FEW are disposed on one side of the seal portion R and arranged in a longitudinal direction fx, along which a large current from the power supply flows.

One end (inner lead portion) of each of the power-supply lead terminals FSU, FSV, and FSW, is sealed by the seal portion R, and the other end (outer lead portion) is connected to a power supply wiring line (not shown) for supplying power.

One end (inner lead portion) of each of the ground lead terminals FEU, FEV, and FEW is sealed by the seal portion R, and the other end (outer lead portion) is connected to a ground wiring line (not shown) that is grounded.

The input/output lead terminals TU, TV, and TW, and the high-side-gate lead terminals GU1, GV1, and GW1 and the low-side-gate lead terminals GU2, GV2, and GW2 for a control operation are disposed on the other side (that faces, in a lateral direction f, the one side that extends along the longitudinal direction fx) and arranged in the longitudinal direction fx of the seal portion R.

As shown in FIG. 2, the high-side first electronic elements MU1, MV1, and MW1 are disposed within the seal portion R. The first electronic elements MU1, MV1, and MW1 are MOSFETs as shown in FIG. 4, for example.

For example, a first electrode (control electrode (gate electrode)) GT1 and a second electrode (source electrode) ST1 are disposed on a top surface of the first electronic element MV1 (FIG. 2). The surface area of the first electrode (gate electrode) GT1 is smaller than that of the second electrode (source electrode) ST1.

The width of the first connecting element GC1 measured in in the longitudinal direction fx of the seal portion R is narrower than that of the second connecting element SC1.

The low-side second electronic elements MU2, MV2, and MW2 are disposed within the seal portion R. The second electronic elements MU2, MV2, and MW2 are MOSFETs as shown in FIG. 4, for example.

For example, a third electrode (control electrode (gate electrode)) GT2 and a fourth electrode (source electrode) ST2 are disposed on a top surface of the second electronic element MV2 (FIG. 2). The surface area of the third electrode (gate electrode) GT2 is smaller than that of the fourth electrode (source electrode) ST2.

The width of the third connecting element GC2 measured in the longitudinal direction fx of the seal portion R is narrower than that of the fourth connecting element SC2.

One end (inner lead portion) of the input/output lead terminal TU is sealed by the seal portion R and connected to the fourth connecting element (source clip) SC2, and the other end (outer lead portion) is connected to a U-phase coil of the motor (FIG. 2).

One end (inner lead portion) of the input/output lead terminal TV is sealed by the seal portion R and connected to the fourth connecting element (source clip) SC2, and the other end (outer lead portion) is connected to a V-phase coil of the motor (FIG. 2).

One end (inner lead portion) of the input/output lead terminal TW is sealed by the seal portion R and connected to the fourth connecting element (source clip) SC2, and the other end (outer lead portion) is connected to a W-phase coil of the motor (FIG. 2).

The width in the longitudinal direction fx of each of the high-side-gate lead terminals (second lead terminals) GU1, GV1, and GW1 and each of the low-side-gate lead terminals (fourth lead terminals) GU2, GV2, and GW2, to which a control signal (gate voltage) is applied, is narrower than the width in the longitudinal direction fx of each of the lead terminals TU, TV, TW for output, the power-supply lead terminals FSU, FSV, and FSW, and the ground lead terminals FEU, FEV, and FEW, through which a drive current of the motor flows.

The semiconductor device 100 according to the first embodiment has a configuration of a three-phase bridge circuit for driving a motor.

For example, as shown in FIG. 4, one end (drain electrode) of the high-side first electronic element (MOSFET) MU1 in the U phase is connected to the power-supply lead terminal FSU, another end (source electrode) is connected to the input/output lead terminal TU via the second connecting element (source clip) SC1, and a control terminal (gate electrode) is connected to the gate lead terminal GU1 via the first connecting element (gate clip) GC1.

One end (drain electrode) of the low-side second electronic element (MOSFET) MU2 in the U phase is connected to the input/output lead terminal TU, another end (source electrode) is connected to the ground lead terminal FEU via the fourth connecting element (source clip) SC2, and a control terminal (gate electrode) is connected to the lead terminal GU2 via the third connecting element (gate clip) GC2.

As shown in FIG. 4, one end (drain electrode) of the high-side first electronic element (MOSFET) MV1 in the V phase is connected to the power-supply lead terminal FSV, another end (source electrode) is connected to the input/output lead terminal TV via the first connecting element (source clip) SC1, and a control terminal (gate electrode) is connected to the gate lead terminal GV1 via the first connecting element (gate clip) GC1.

One end (drain electrode) of the low-side second electronic element (MOSFET) MV2 in the V phase is connected to the input/output lead terminal TV, another end (source electrode) is connected to the ground lead terminal FEV via the fourth connecting element (source clip) SC2, and a control terminal (gate electrode) is connected to the gate lead terminal GV2 via the third connecting element (gate clip) GC2.

As shown in FIG. 4, one end (drain electrode) of the high-side first electronic element (MOSFET) MW1 in the W phase is connected to the power-supply lead terminal FSW, another end (source electrode) is connected to the input/output lead terminal TW via the first connecting element (source clip) SC1, and a control terminal (gate electrode) is connected to a gate lead terminal GW1 via the first connecting element (gate clip) GC1.

One end (drain electrode) of the low-side second electronic element (MOSFET) MW2 in the W phase is connected to the input/output lead terminal TW, another end (source electrode) is connected to the ground lead terminal FEW via the fourth connecting element (source clip) SC2, and a control terminal (gate electrode) is connected to the gate lead terminal GW2 via the third connecting element (gate clip) GC2.

An example of a configuration in the V phase of the semiconductor device 100 will be described in detail below with reference to FIGS. 2, 5, and 6A-6B. Configurations of the U phase and the W phase of the semiconductor device 100 are the same as the configuration of the V phase.

Figure 5:
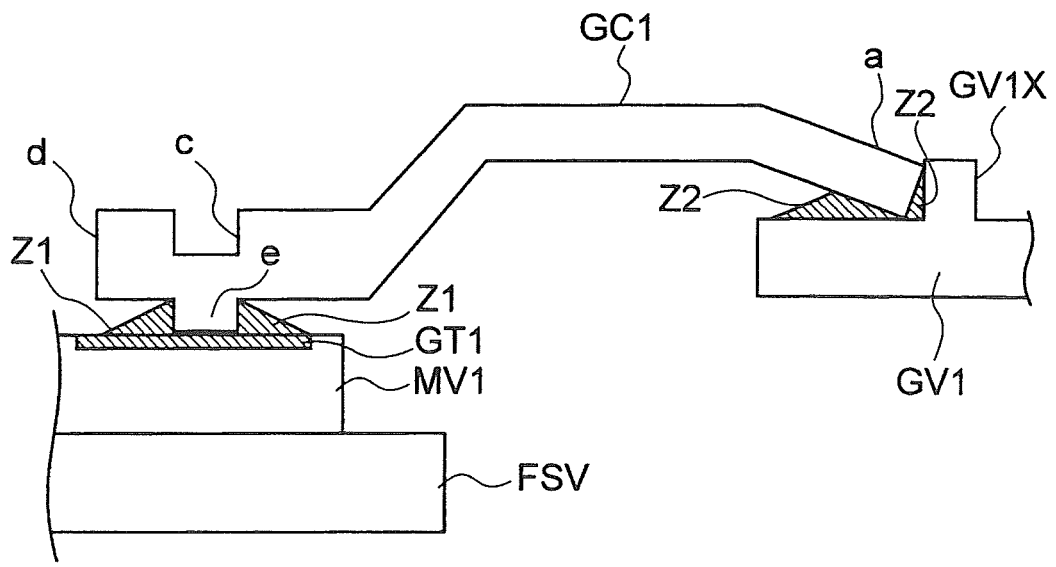
FIG. 5 is a cross-sectional view illustrating an example of a structure of a gate clip connected between the electronic element and the lead terminal shown in FIG. 2.

FIG. 5 is a cross-sectional view illustrating an example of a structure of a gate clip connected between the electronic element and the lead terminal shown in FIG. 2. FIGS. 6A-6B illustrate the example of the structure of the gate clip (connecting element) shown in FIG. 5.

For example, as shown in FIG. 2, after the first and second electronic elements MV1 and MV2 are electrically connected to any of the lead terminals FSV, TV, FEV, GV1, and GV2 via any of the connecting elements GC1, SC1, GC2, and SC2, the seal portion R seals a part of each of the lead terminals FSV, TV, FEV, GV1, and GV2, and the first and second electronic elements MV1 and MV2.

The seal portion R is formed of an epoxy resin, for example.

The power-supply lead terminal (first lead terminal) FSV has one end (inner lead portion), on a top surface of which the first electronic element MV1 is disposed within the seal portion R, and the other end (outer lead portion) that is exposed from the one end of the seal portion R, which extends along the longitudinal direction fx, as shown in FIG. 2.

The one end (inner lead portion) of the input/output lead terminal (third lead terminal) TV is disposed to be close to the one end (inner lead portion) of the power-supply lead terminal (first lead terminal) FSV within the seal portion R.

On the top surface of the one end (inner lead portion) of the input/output lead terminal (third lead terminal) TV within the seal portion R, the second electronic element MV2 is disposed. The other end (outer lead portion) is exposed from the other end of the seal portion R, which extends along the longitudinal direction fx.

The ground lead terminal (fifth lead terminal) FEV has one end (inner lead portion) that is disposed within the seal portion R, and the other end (outer lead portion) that is exposed from the one end of the seal portion R, which extends along the longitudinal direction fx.

As shown in FIG. 2, the high-side-gate lead terminal (second lead terminal) GV1 has one end (inner lead portion) that is disposed in the vicinity of the one end of the first lead terminal FSV within the seal portion R, and the other end (outer lead portion) that is exposed from the other end of the seal portion R, which extends along the longitudinal direction fx.

The low-side-gate lead terminal (fourth lead terminal) GV2 has one end (inner lead portion) that is disposed in the vicinity of the one end (inner lead portion) of the third lead terminal TV within the seal portion R, and the other end (outer lead portion) that is exposed from the other end of the seal portion R, which extends along the longitudinal direction fx.

The width along the longitudinal direction fx of each of the high-side-gate lead terminal (second lead terminal) GV1 and the low-side-gate lead terminal (fourth lead terminal) GV2, to which the control signal (gate voltage) is applied, is narrower than the width along the longitudinal direction fx of each of the output lead terminal TV, the power-supply lead terminal FSV, and the ground lead terminal FEV, through which the drive current of the motor flows.

As described above, the first electronic element (MOS-FET) MV1 is disposed within the seal portion R (FIGS. 2 and 5).

On the top surface of the first electronic element MV1, the first electrode (gate electrode) GT1, which is a control electrode, and the second electrode (source electrode) ST1 are disposed (FIGS. 2 and 5).

The surface area of the first electrode (gate electrode) GT1 is smaller than that of the second electrode (source electrode) ST1.

An electrode (drain electrode) of the first electronic element MV1, which is not shown, is disposed on a lower surface of the first electronic element MV1 and electrically connected to the top surface of the one end of the first lead terminal FSV.

The first connecting element GC1 has one end d that is spaced apart from the top surface of the one end (inner lead portion) of the power-supply lead terminal (first lead terminal) FSV (FIG. 5). Thus, the tip of the one end d of the first connecting element GC1 is prevented from contacting the top surface (such as a wiring line) of the one end (inner lead portion) of the power-supply lead terminal (first lead terminal) FSV.

The thickness of the first lead terminal FSV is the same as the thickness of the second lead terminal GV1 (FIG. 5).

As shown in FIG. 5, for example, the height of the top surface of the one end of the second lead terminal GV1 is higher than the height of the top surface of the first electrode (gate electrode) GT1 disposed on the first electronic element MV1.

As shown in FIG. 2, the first connecting element (gate clip) GC1 is disposed within the seal portion R.

The one end d of the first connecting element GC1 is electrically connected to the first electrode (gate electrode) GT1, which is a control electrode of the first electronic element MV1, with a conductive bonding agent Z1, as shown in FIG. 5, for example.

The one end d of the first connecting element GC1 has a protrusion e that protrudes downward and is electrically connected to the first electrode GT1, which is the control electrode of the first electronic element MV1, with the conductive bonding agent Z1.

In the example of FIG. 5, the protrusion e on the lower surface of the one end d of the first connecting element GC1 is electrically connected to the electrode (gate electrode) GT1 of the first electronic element MV1 with the conductive bonding agent Z1.

The protrusion e at the one end d of the first connecting element GC1 is formed by pressing (from above) the top surface of the one end d of the first connecting element GC1 so that the lower surface protrudes downward.

A concave c is formed on the side opposite to the protrusion e as a result of the pressing of the one end d of the first connecting element GC1. In other words, the side opposite to the protrusion e (upper side) of the one end d of the first connecting element GC1 is recessed.

The conductive bonding agent Z1 joins the other end of the first connecting element GC1 and the one end of the second lead terminal GV1 in a conductive manner. The conductive bonding agent Z1 is, for example, a soldering material.

As shown in FIG. 5, the other end a of the first connecting element (gate clip) GC1 is electrically connected to the one end of the second lead terminal GV1 with a conductive bonding agent Z2.

The conductive bonding agent Z2 joins the other end of the first connecting element GC1 and the one end of the second lead terminal GV1 in a conductive manner. The conductive bonding agent Z2 is, for example, a soldering material.

As shown in FIG. 5 and FIG. 6A, for example, a second side surface g of the first connecting element GC1, which extends from the one end d to the other end a on a side opposite to a first side surface b is angled in an area between the one end d and the other end a of the first connecting element GC1 so that the width Xc of the other end d of the first connecting element is narrower than the width Xa of the other end a.

Thus, the first connecting element (gate clip) GC1 has a linear side surface (first side surface b) that is in the vicinity of the second connecting element (source clip) SC1, and an angled side surface (second side surface g) that is opposite to the linear side surface, so that the other end a has a greater width.

This enables the first connecting element GC1 not to fall over in the side surface direction (longitudinal direction fx) (FIG. 2).

Furthermore, as shown in FIGS. 5 and 6A-6B, the width Xc of the one end d of the first connecting element GC1 is narrower than the width Xa of the other end a of the first connecting element GC1. The width Xa of the other end a of the first connecting element GC1 is narrower than the width of the one end of the second lead terminal GV1.

Thus, the width of the one end d of the first connecting element GC1 is set to be narrow to fit the width of the first electrode (gate electrode) GT1 having a small surface area, and the width Xa of the other end a of the first connecting element GC1 is set to be wide to fit the width of the one end of the second lead terminal GV1, so that the connection of the first connecting element GC1 and the second lead terminal GV1 may be enhanced.

The first side surface b extending from the one end d to the other end a of the first connecting element GC1 is parallel to the direction in which the second lead terminal GV1 extends (horizontal direction; for example, the lateral direction or the longitudinal direction fx of the seal portion R; in the example of FIGS. 6A-6B, the lateral direction f) (FIG. 6B).

As shown in FIG. 2, the second connecting element (source clip) SC1 is disposed within the seal portion. The second connecting element SC1 has one end that is electrically connected to the second electrode (source electrode) ST1, which is an input/output electrode disposed on the top surface of the first electronic element MV1, and the other end that is electrically connected to the one end of the third lead terminal TV. The second connecting element SC1 extends in the lateral direction f.

The second connecting element SC1 is disposed to be adjacent to the first connecting element GC1 so that its side surface extending in the direction in which the second connecting element SC1 extends (lateral direction f) faces the first side surface b of the first connecting element GC1, as shown in FIGS. 2 and 6A-6B, for example. In other words, the first side surface b of the first connecting element GC1 is adjacent to the second connecting element SC1.

As a result, the distance between the first connecting element GC1 and the second connecting element SC1 may be reduced while the falling of the first connecting element GC1 is prevented. Furthermore, the distance between the first electrode (gate electrode) GT1 and the second electrode (source electrode) ST1 on the top surface of the first electronic element MV1 may also be reduced.

Since the connecting elements may be disposed with a higher density, the semiconductor device 100 may be downsized further.

As described above, the surface area of the first electrode (gate electrode) GT1 is smaller than that of the second electrode (source electrode) ST1.

Furthermore, in the longitudinal direction fx in the seal portion R, the width of the first connecting element GC1 is narrower than the width of the second connecting element SC1 (FIG. 2). In other words, the width of the second connecting element SC1 is broader than the width of the first connecting element GC1.

The drive current of the motor flows through the second connecting element SC1, which is a source clip, and the control signal (gate voltage) is applied to the first connecting element GC1, which is a gate clip.

Therefore, the width (size) of the wiring path of the first connecting element GC1 is narrower (smaller) than the width (size) of the wiring path of the second connecting element SC1, and the surface area of the first electrode (gate electrode) GT1 is smaller than the surface area of the second electrode (source electrode) ST1.

A wall portion GV1X protrudes from the top surface of the one end of the second lead terminal GV1 (FIG. 5).

When the other end of the first connecting element GC1 and the one end of the second lead terminal GV1 are joined to each other, the wall portion GV1X blocks the conductive bonding agent Z2 that is melted.

The wall portion GV1X of the second lead terminal GV1 is in contact with the other end a of the first connecting element GC1. In the example of FIG. 5, the other end a of the first connecting element GC1 is bent downward to contact the wall portion GV1X.

The conductive bonding agent Z2 is drawn to the wall portion GV1X by surface tension force, so that the other end a, which is bent downward, of the first connecting element GC1 is fixed at a predetermined position.

The wall portion GV1X is disposed on the top surface of the one end of the second lead terminal GV1 so as to be perpendicular (extend in the longitudinal direction fx) to the direction (the lateral direction f) along which the one end of the second lead terminal GV1 extends, as shown in FIGS. 2 and 5, for example.

A plurality of wall portions GV1X may be disposed on the top surface of the one end of the second lead terminal GV1.

In the example of FIG. 2, the length of the wall portion GV1X is the same as the width of the one end of the second lead terminal GV1.

This prevents the conductive bonding agent Z2 from flowing around the wall portion GV1X to the opposite side of the second lead terminal GV1.

The conductive bonding agent Z2 is brought into contact with the wall portion GV1X by the surface tension force when the one end (inner lead portion) of the second lead terminal GV1 and the other end of the first connecting element GC1 are joined together.

Since the wall portion GV1X determines the position at which the first connecting element GC1 is joined to the second lead terminal GV1, the first connecting element GC1 is joined at a predetermined position. The wall portion GV1X fixes (by mold lock) the second lead terminal GV1.

As a result, the first connecting element (gate clip) GC1 and the first electrode (gate electrode) GT1 are surely joined by soldering at the predetermined position, which may prevent the one end d of the first connecting element (gate clip) GC1 from being electrically connected to other wiring portion.

Furthermore, as shown in FIG. 5, the height (the position of the top surface) of the wall portion GV1X on the top surface of the one end of the second lead terminal GV1 is higher than the height (the position of the top surface) of the conductive bonding agent Z2 on the top surface of the one end of the second lead terminal GV1.

Thus, the conductive bonding agent Z2 does not flow over the wall portion GV1X on the top surface of the one end of the second lead terminal GV1 when the one end (inner lead portion) of the second lead terminal GV1 and the other end of the first connecting element GC1 are joined together.

As shown in FIG. 2, the second electronic element (MOSFET) MV2 is disposed within the seal portion R.

As described above, the third electrode (gate electrode) GT2, which is a control electrode, and the fourth electrode (source electrode) ST2 are disposed on the top surface of the second electronic element MV2 (FIG. 2).

The surface area of the third electrode (gate electrode) GT2 is smaller than that of the fourth electrode (source electrode) ST2.

The electrode (drain electrode) that is not shown is disposed on the lower surface of the second electronic element MV2 and electrically connected to the top surface of the one end of the third lead terminal TV.

The width of the third connecting element GC2 in the longitudinal direction fx in the seal portion R is narrower than the width of the fourth connecting element SC2 (FIG.

2). In other words, the width of the fourth connecting element SC2 is broader than the width of the third connecting element GC2.

The drive current of the motor flows through the fourth connecting element SC2, which is a source clip, and the control signal (gate voltage) is applied to the third connecting element GC2, which is a gate clip. Therefore, the width (size) of the wiring path of the third connecting element GC2 is narrower (smaller) than that of the fourth connecting element SC2, and the surface area of the third electrode (gate electrode) GT2 is smaller than that of the fourth electrode (source electrode) ST2.

As shown in FIG. 2, the third connecting element GC2 is disposed within the seal portion R, and has one end that is electrically connected to the third electrode GT2 of the second electronic element MV2, and the other end that is connected to the one end of the fourth lead terminal GV2.

As shown in FIG. 2, the fourth connecting element SC2 is disposed within the seal portion R. The fourth connecting element SC2 has one end that is electrically connected to the fourth electrode (source electrode) ST2 disposed on the top surface of the second electronic element MV2, and the other end that is electrically connected to the one end of the fifth lead terminal FEV. The fourth connecting element SC2 extends in the lateral direction f.

A wall portion GV2X protrudes from the top surface of the one end of the fourth lead terminal GV2 (FIG. 2).

The wall portion GV2X blocks a melted conductive bonding agent (not shown) when the other end of the third connecting element GC2 and the one end of the fourth lead terminal GV2 are joined together.

The wall portion GV2X is disposed on the top surface of the one end of the fourth lead terminal GV2 so as to be perpendicular (lateral direction f) to the direction (the longitudinal direction fx) along which the one end of the fourth lead terminal GV2 extends, as shown in FIG. 2.

A plurality of wall portions GV2X may be disposed on the top surface of the one end of the fourth lead terminal GV2.

In the example of FIG. 2, the length of the wall portion GV2X is the same as the width of the one end of the fourth lead terminal GV2.

The other features in the structures of the third and fourth connecting elements GC2 and SC2 are the same as those of the first and second connecting elements GC1 and SC1, for example.

As described above, the V phase of the semiconductor device 100 according to the embodiment has been described with reference to FIGS. 2, 5, and 6A-6B. The structures of the U phase and the W phase of the semiconductor device 100 are the same as the structure of the V phase.

Thus, a semiconductor device according to an aspect of the present invention includes a seal portion, an electronic element disposed within the seal portion, a first lead terminal having one end, on a top surface of which the electronic element is disposed within the seal portion, and another end that is exposed from the seal portion, a second lead terminal having one end that is close to the one end of the first lead terminal within the seal portion, and another end that is exposed from the seal portion, a first connecting element (gate clip) disposed within the seal portion, and having one end that is electrically connected to a control electrode (gate electrode) of the electronic element, and another end that is electrically connected to the one end of the second lead terminal, a first conductive bonding agent for joining together the control electrode of the electronic element and the one end of the first connecting element in a conductive manner, and a second conductive bonding agent for joining together the other end of the first connecting element and the one end of the second lead terminal in a conductive manner.

The one end of the first connecting element has a protrusion that protrudes downward and is electrically connected to the control electrode of the electronic element with the first conductive bonding agent.

The width of the one end of the first connecting element is narrower than the width X of the other end of the first connecting element, which is narrower than the width of the one end of the second lead terminal.

A first side surface extending from the one end to the other end of the first connecting element is parallel to a straight line extending in a horizontal direction (for example, the lateral direction or the longitudinal direction of the seal portion).

Thus, the one end of the first connecting element is connected to the control electrode, which is small, of the electronic element by the protrusion, and the other end, which is broader than the one end, of the first connecting element is stably connected to the one end of the second lead terminal, which is broad (so that the first connecting element does not fall over).

Therefore, in the semiconductor device according to the present invention, connection failures of connecting elements may be prevented to improve reliability.

While certain embodiments have been described, these embodiments have been presented by way of example only, and are not intended to limit the scope of the inventions. The embodiments may be embodied in a variety of other forms. Furthermore, various omissions, substitutions and changes in the form of the methods and systems described herein may be made without departing from the spirit of the inventions. The embodiments and their modifications are included in the scope and the subject matter of the invention, and at the same time included in the scope of the claimed inventions and their equivalents.

EXPLANATION OF REFERENCES

100: semiconductor device
R: seal portion
MU1: high-side first electronic element
MV1: high-side first electronic element
MW1: high-side first electronic element
MU2: low-side second electronic element
MV2: low-side second electronic element
MW2: low-side second electronic element
FSU: power-supply lead terminal
FSV: power-supply lead terminal
FSW: power-supply lead terminal
FEU: ground lead terminal
FEV: ground lead terminal
FEW: ground lead terminal
TU: input/output lead terminal
TV: input/output lead terminal
TW: input/output lead terminal
GU1: high-side-gate lead terminal
GV1: high-side-gate lead terminal
GW1: high-side-gate lead terminal
GU2: low-side-gate lead terminal
GV2: low-side-gate lead terminal
GW2: low-side-gate lead terminal
GC1: high-side first connecting element (gate clip)
GC2: low-side third connecting element (gate clip)
SC1: high-side second connecting element (source clip)
SC2: low-side fourth connecting element (source clip)

The invention claimed is:

1. A semiconductor device, comprising:

a seal portion;

an electronic element disposed within the seal portion;

a first lead terminal having one end, on a top surface of which the electronic element is disposed within the seal portion, and another end that is exposed from the seal portion;

a second lead terminal having one end that is disposed to be close to the one end of the first lead terminal within the seal portion, and another end that is exposed from the seal portion;

a first connecting element disposed within the seal portion, and having one end that is electrically connected to a control electrode of the electronic element, and another end that is electrically connected to the one end of the second lead terminal;

a first conductive bonding agent for joining together the control electrode of the electronic element and the one end of the first connecting element in a conductive manner;

a second conductive bonding agent for joining together the other end of the first connecting element and the one end of the second lead terminal;

a third lead terminal having one end disposed to be close to the one end of the first lead terminal within the seal portion, and another end that is exposed from the seal portion; and a second connecting element having one end that is electrically connected to an input/output electrode of the electronic element, and another end that is electrically connected to the one end of the third lead terminal, the one end of the second connecting element extending in an extending direction, wherein the one end of the first connecting element has a protrusion that protrudes downward and is electrically connected to the control electrode of the electronic element with the first conductive bonding agent, wherein a width of the one end of the first connecting element is narrower than a width of the other end of the first connecting element, and the width of the other end of the first connecting element is narrower than a width of the one end of the second lead terminal, wherein a first side surface extending from the one end to the other end of the first connecting element is parallel to the extending direction along which the one end of the second connecting element extends, wherein a second side surface extending from the one end to the other end of the first connecting element on a side opposite to the first side surface is angled in an area between the one end and the other end of the first connecting element so that the width of the one end of the first connecting element is narrower than the width of the other end of the first connecting element, wherein the second connecting element is disposed to be adjacent to the first connecting element so that a side surface extending in the extending direction along which the one end to the other end of the second connecting element extends faces the first side surface of the first connecting element, wherein a wall portion is disposed on a top surface of the one end of the second lead terminal for blocking the second conductive bonding agent, wherein the wall portion is in contact with the other end of the first connecting element, wherein the wall portion is disposed on the top surface of the one end of the second lead terminal so as to be perpendicular to a direction in which the one end of the second lead terminal extends, wherein the second conductive bonding agent is in contact with the wall portion due to a surface tension force when the other end of the first connecting element and the one end of the second lead terminal are joined together, wherein the wall portion of the second lead terminal is in contact with the other end of the first connecting element, and the other end of the first connecting element is bent downward to contact the wall portion, wherein the conductive bonding agent is drawn to the wall portion by surface tension force, so that the other end, which is bent downward, of the first connecting element is fixed at a predetermined position, and wherein a length of the wall portion is the same as the width of the one end of the second lead terminal.

2. The semiconductor device according to claim 1, wherein a height of the top surface of the one end of the second lead terminal is higher than a height of a top surface of the control electrode of the electronic element.

3. The semiconductor device according to claim 1, wherein the other end of the first connecting element is bent downward.

4. The semiconductor device according to claim 1, wherein the first conductive bonding agent and the second conductive bonding agent are soldering materials.

5. The semiconductor device according to claim 1, wherein the protrusion at the one end of the first connecting element is formed by pressing the one end from above to protrude downward.

6. The semiconductor device according to claim 1, a side opposite to the protrusion of the one end of the first connecting element is recessed.

7. The semiconductor device according to claim 1, wherein a width of the second connecting element is broader than a width of the first connecting element.

8. The semiconductor device according to claim 1, wherein a tip of the one end of the first connecting element is spaced apart from the top surface of the one end of the first lead terminal.

9. The semiconductor device according to claim 1, wherein a height of the wall portion on the top surface of the one end of the second lead terminal is higher than a height of the second conductive bonding agent on the top surface of the one end of the second lead terminal.

* * * * *